United States Patent
Takei et al.

(10) Patent No.: US 10,509,320 B2
(45) Date of Patent: Dec. 17, 2019

(54) UNDERLYING COATING FORMING COMPOSITION FOR LITHOGRAPHY CONTAINING COMPOUND HAVING PROTECTED CARBOXYL GROUP

(75) Inventors: Satoshi Takei, Toyama (JP); Tetsuya Shinjo, Toyama (JP); Keisuke Hashimoto, Toyama (JP); Yasushi Sakaida, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 11/795,520

(22) PCT Filed: Jan. 6, 2006

(86) PCT No.: PCT/JP2006/300080
§ 371 (c)(1),
(2), (4) Date: Aug. 6, 2007

(87) PCT Pub. No.: WO2006/077748
PCT Pub. Date: Jul. 27, 2006

(65) Prior Publication Data
US 2008/0102649 A1    May 1, 2008

(30) Foreign Application Priority Data
Jan. 21, 2005  (JP) .................................. 2005-014652

(51) Int. Cl.
G03F 7/09    (2006.01)
G03F 7/26    (2006.01)
G03F 7/30    (2006.01)

(52) U.S. Cl.
CPC .............. G03F 7/091 (2013.01); G03F 7/094 (2013.01); G03F 7/26 (2013.01); G03F 7/30 (2013.01)

(58) Field of Classification Search
CPC .......... G03F 7/094; G03F 7/091; G03F 7/161; G03F 7/168
See application file for complete search history.

(56) References Cited

U.S. PATENT DOCUMENTS

| | | | |
|---|---|---|---|
| 5,521,011 A * | 5/1996 | Ishidoya et al. .............. | 428/413 |
| 6,054,254 A | 4/2000 | Sato et al. | |
| 6,165,684 A | 12/2000 | Mizutani et al. | |
| 6,444,320 B1 * | 9/2002 | Takei ................. | C08G 59/1455 |
| | | | 428/413 |
| 2002/0068172 A1 * | 6/2002 | Nishiguchi et al. .......... | 428/413 |
| 2002/0077426 A1 * | 6/2002 | Iguchi .................... | C08L 81/06 |
| | | | 525/330.5 |
| 2003/0018150 A1 | 1/2003 | Hong et al. | |
| 2003/0022102 A1 * | 1/2003 | Hiraoka et al. ............ | 430/270.1 |
| 2003/0146416 A1 * | 8/2003 | Takei ..................... | C08L 25/18 |
| | | | 252/500 |
| 2004/0048950 A1 * | 3/2004 | Nishida et al. ............... | 523/160 |

FOREIGN PATENT DOCUMENTS

| | | |
|---|---|---|
| EP | 1 617 289 A | 1/2006 |
| EP | 1 662 769 A | 5/2006 |
| JP | A-10-186671 | 7/1998 |
| JP | A-11-072925 | 3/1999 |
| JP | A-2000-294504 | 10/2000 |
| JP | A-2001-083696 | 3/2001 |
| JP | A-2002-047430 | 2/2002 |
| JP | A-2002-128847 | 5/2002 |
| JP | A-2002-190519 | 7/2002 |
| WO | WO 02/05035 A1 | 1/2002 |
| WO | WO 2004/090640 | 10/2004 |
| WO | WO 2004/090640 A1 | 10/2004 |

OTHER PUBLICATIONS

Layadi et al "An Introduction to Plasma Etching for VLSI Circuit Tehnology", Bell Labs Technical Journal Jul.-Sep. 1999, pp. 155-171.*
Supplementary European Search Report of Application No. EP 06 70 2060; dated Jan. 12, 2009.

* cited by examiner

Primary Examiner — Cynthia Hamilton
(74) Attorney, Agent, or Firm — Oliff PLC

(57) ABSTRACT

There is provided an underlayer coating forming composition for lithography that is used in lithography process of the manufacture of semiconductor devices and that has a high dry etching rate in comparison to photoresists, does not intermix with photoresists, and is capable of flattening the surface of a semi conductor substrate having holes of a high aspect ratio.

The underlayer coating forming composition for lithography comprises, a compound having two or more protected carboxylic groups, a compound having two or more epoxy groups, and a solvent.

8 Claims, 1 Drawing Sheet

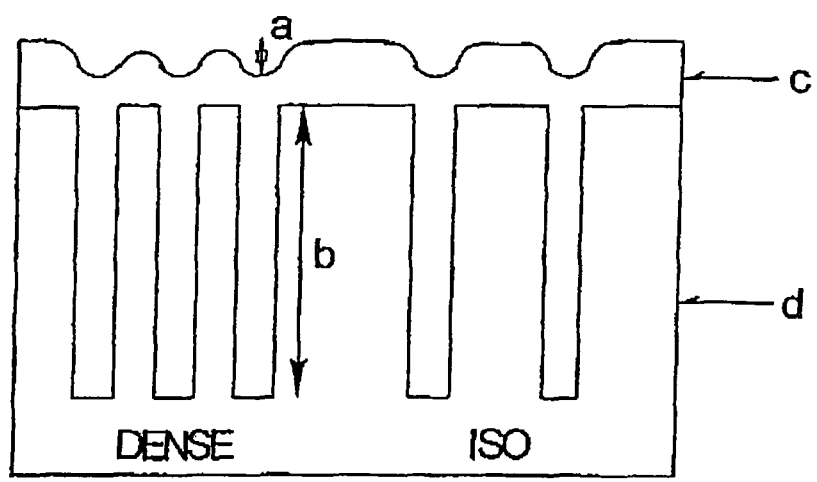

UNDERLYING COATING FORMING COMPOSITION FOR LITHOGRAPHY CONTAINING COMPOUND HAVING PROTECTED CARBOXYL GROUP

TECHNICAL FIELD

The present invention relates to a novel composition for forming underlayer coating for lithography, an underlayer coating formed from the composition and a method for forming photoresist pattern by use of the underlayer coating. In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like, an underlayer coating forming composition for forming the underlayer coating, and a method for forming the underlayer coating. Further, the present invention relates to a composition for forming underlayer coating for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin coating of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective coating, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm). Along with this change, influences of random reflection and standing wave of actinic rays from a substrate have become serious problems. Accordingly, it has been widely studied to provide an anti-reflective coating between the photoresist and the substrate (bottom anti-reflective coating) in order to resolve the problem. As the anti-reflective coating, from a viewpoint of easy of use or the like, many considerations have been done on organic anti-reflective coatings made of a light absorbing substance and a polymer compound and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule. The properties desired for organic anti-reflective coating include high absorbance to light and radioactive rays, no intermixing with the photoresist layer (being insoluble in photoresist solvents), no diffusion of low molecular substances from the anti-reflective coating into the topcoat photoresist upon baking under heating, and a higher dry etching rate than the photoresist, etc. In recent years, in order to solve interconnection delay that has become clear with miniaturization in pattern rule of semiconductor devices, it has been considered to use copper as interconnect material, and to apply Dual Damascene process as interconnect forming method on the semiconductor substrate. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like. However, it is difficult to apply organic material for anti-reflective coating on a substrate having a high aspect ratio, and in recent years, material with particular emphasis on filling property or flattening property has been developed (see, for example Patent Documents 1, 2, 3 and 4).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 5).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist. And, in order to satisfy required performance for underlayer coatings for which the diversity is increased, it is always required to develop new underlayer coatings.

On the other hand, an underlayer coating forming composition for lithography containing a compound having a carboxyl group and an epoxy group therein is known (see, for example Patent Document 6).

Patent Document 1; JP2000-294504
Patent Document 2; JP2002-47430
Patent Document 3; JP2002-190519
Patent Document 4; WO 02/05035 pamphlet
Patent Document 5; JP2002-128847
Patent Document 6; WO 04/090640 pamphlet

DISCLOSURE OF INVENTION

Problems to be Solved by the Invention

An object of the present invention is to provide an underlayer coating forming composition for lithography that can be used for the manufacture of semiconductor devices, and to provide an underlayer coating for lithography that causes no intermixing with a photoresist layer applied and formed as an upper layer and that has a high dry etching rate compared with the photoresist layer, and an underlayer coating forming composition for forming the underlayer coating.

Further, another object of the present invention is to provide an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like, and an underlayer coating forming composition for forming the underlayer coating. Further, an object of the present invention is to provide a method for forming underlayer coating for lithography by use of the underlayer coating forming composition, and a method for forming a photoresist pattern. Still further, an object of the present invention is to provide a method for flattening the surface of semiconductor substrate having holes of an aspect ratio shown in height/diameter of 1 or more.

Means for Solving the Problem

Taking the above-mentioned present status into account, the present inventors eagerly investigated, and as a result of it, they found that an excellent underlayer coating can be formed from a composition containing a compound having two or more protected carboxyl groups and a compound having two or more epoxy groups.

The present invention relates to the following aspects:

as a first aspect, an underlayer coating forming composition for lithography comprising:
a compound having two or more protected carboxy groups of formula (1):

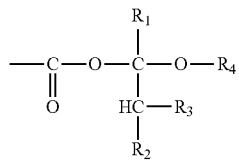

wherein $R_1$, $R_2$, and $R_3$ are independently of one another, hydrogen atom or $C_{1-10}$ alkyl group, $R_4$ is $C_{1-10}$ alkyl group, or $R_3$ and $R_4$ together may form a ring:
a compound having two or more epoxy groups; and
a solvent;

as a second aspect, the underlayer coating forming composition for lithography according to the first aspect, wherein the compound having two or more protected carboxyl groups of formula (1) is a polymer having two or more protected carboxyl groups of formula (1);

as a third aspect, the underlayer coating forming composition for lithography according to the first aspect, wherein the compound having two or more protected carboxyl groups of formula (1) is a compound having 2 to 6 carboxyl groups with a molecular weight of 1500 or less;

as a fourth aspect, the underlayer coating forming composition for lithography according to the first aspect, wherein the compound having two or more epoxy groups is a polymer having two or more epoxy groups;

as a fifth aspect, the underlayer coating forming composition for lithography according to the first aspect, wherein the compound having two or more epoxy groups is a compound having from 2 to 6 epoxy groups with a molecular weight of 1500 or less;

as a sixth aspect, the underlayer coating forming composition for lithography according to the second aspect, wherein the polymer having two or more protected carboxyl groups of formula (1) is a polymer having a structural unit of formula (2):

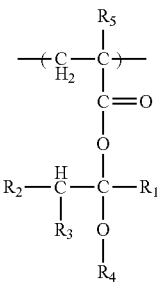

wherein $R_1$, $R_2$, $R_3$, and $R_4$ are as defined above and $R_5$ is hydrogen atom or methyl group;

as a seventh aspect, the underlayer coating forming composition for lithography according to the fourth aspect, wherein the polymer having two or more epoxy groups is a polymer having a structural unit of formula (3):

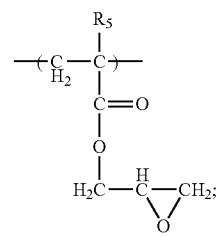

as an eighth aspect, the underlayer coating forming composition for lithography according to the third aspect, wherein the compound having from 2 to 6 protected carboxyl groups of formula (1) with a molecular weight of 1500 or less is a compound of formula (4):

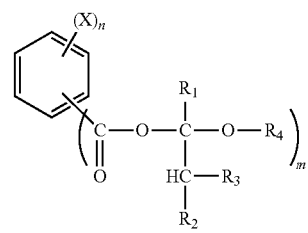

wherein X is hydrogen atom, $C_{1-10}$ alkyl group, $C_{1-10}$ alkoxy group, nitro group, cyano group, or halogen group, m is an integer of 2 to 6, and when n is 2 or more, Xs are identical with or different from each other;

as a ninth aspect, the underlayer coating forming composition for lithography according to the third aspect, wherein the compound having 2 to 6 protected carboxyl groups of formula (1) with a molecular weight of 1500 or less is an isocyanuric acid compound having 2 or 3 protected carboxyl groups of formula (1);

as a tenth aspect, a method for forming an underlayer coating for use in manufacture of semiconductor device, comprising:
applying the underlayer coating forming composition for lithography according to any one of the first to ninth aspects on a semiconductor substrate, and baking it;

as an eleventh aspect, a method for flattening surface of semiconductor substrate having hole of an aspect ratio shown in height/diameter of 1 or more, comprising the steps of:

applying the underlayer coating forming composition for lithography according to any one of the first to ninth aspects on the semiconductor substrate; and baking the semiconductor substrate after the applying step; and as a twelfth aspect, a method for forming photoresist pattern for use in manufacture of semiconductor device, comprising the steps of:

applying the underlayer coating forming composition for lithography according to any one of the first to ninth aspects on a semiconductor substrate, and baking it to form an underlayer coating;

forming a photoresist layer on the underlayer coating;

exposing the semiconductor substrate covered with the underlayer coating and the photoresist layer to light; and developing after the exposing step.

Effect of the Invention

The underlayer coating forming composition for lithography of the present invention can provide an excellent underlayer coating that has a high dry etching rate compared with photoresists, and cause no intermixing with photoresists. The ubderlayer coating forming composition for lithography of the present invention can also flatten a semiconductor substrate having holes an aspect ratio shown in height/diameter of 1 or more.

The underlayer coating forming composition for lithography of the present invention can attain a high filling property inside holes without occurrence of void (gap). As the composition can fill and flatten unevenness on substrates having holes, the film thickness of photoresists formed thereon can be improved in uniformity. Therefore, good photoresist pattern form can be formed even in the process by use of substrates having holes.

In addition, the present invention can provide an underlayer coating forming composition for lithography that is excellent in storage stability.

Further, the underlayer coating forming composition for lithography of the present invention can form underlayer coatings that can be used as an anti-reflective coating, a flattening coating and a coating for preventing contamination of a photoresist layer that is called resist poisoning, etc. Consequently, the present invention enables the formation of photoresist pattern in lithography process of the manufacture of semiconductor device to be carried out easily and in a high accuracy.

BRIEF DESCRIPTION OF THE DRAWING

FIG. 1 is a sectional view of an underlayer coating formed on a substrate having holes, in which symbol a is dimple depth of the underlayer coating at the center of the hole, b is depth of initial hole on the substrate used, c is the underlayer coating, and d is the substrate.

BEST MODE FOR CARRYING OUT THE INVENTION

The underlayer coating forming composition for lithography of the present invention comprises a compound having two or more protected carboxyl groups of formula (1), a compound having two or more epoxy groups, and a solvent. The underlayer coating forming composition of the present invention can comprise, as arbitrary components, a light absorbing compound, a surfactant, and a photoacid generator.

The proportion of the solid content of the underlayer coating forming composition for lithography of the present invention is not specifically limited so long as each component is homogeneously dissolved, but for example, it can be of 0.1 to 70 mass %, 1 to 50 mass %, 5 to 40 mass %, or 10 to 30 mass %. In the specification, the solid content means all the components in the underlayer coating forming composition for lithography from which the solvent is excluded. The proportion of the compound having two or more protected carboxyl groups of formula (1) and the compound having two or more epoxy groups in the solid content is 70 mass % or more, for example, 80 to 100 mass %, 80 to 99 mass %, or 90 to 99 mass %.

In formula (1), $R_1$, $R_2$, and $R_3$ are independently of each other hydrogen atom or $C_{1-10}$ alkyl group, $R_4$ is $C_{1-10}$ alkyl group. $R_3$ and $R_4$ together may form a ring, in other words, $R_3$ and $R_4$ are linked together to form a ring structure with two carbon atoms and one oxygen atom between $R_3$ and $R_4$. The $C_{1-10}$ alkyl group includes methyl group, ethyl group, n-butyl group, n-octyl group, isopropyl group, tert-butyl group, 2-ethylhexyl group, and cyclohexyl group, etc. $R_3$ and $R_4$ together may form a ring, the ring formed as above includes includes tetrahydrofuran ring, tetrahydropyran ring and the like.

The compound having protected carboxyl groups of formula (1) can be produced by reacting a compound having a carboxyl groups with a vinyl ether compound of formula (5).

(5)

The reaction of a compound having carboxyl groups with a vinyl ether compound can be conducted by use of phosphoric acid as a catalyst with stirring at room temperature as described in Journal of the Adhesion Society of Japan, Vol. 34, 352-356. By suitably selecting the compound having carboxyl groups and the compound of formula (5), it is possible to produce a polymer having two or more protected carboxyl groups of formula (1), and a compound having 2 to 6 protected carboxyl groups of formula (1) and a molecular weight of about 2000 or less.

Examples of the vinyl ether compound of formula (5) are aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether, cyclohexyl vinyl ether, and the like, or cyclic vinyl ether compounds such as 2,3-dihydrofuran, 4-methyl-2,3-dihydrofuran, 2,3-dihydro-4H-pyran, and the like.

The compound having carboxyl groups that is reacted with the vinyl ether compound of formula (5) is not specifically limited so liong as it is a compound having two or more protected carboxyl groups. A low molecular weight compound having a carboxyl groups (a compound with a molecular weight of about 2000 or less, but not a polymer), or a polymer having carboxyl groups can be mentioned.

Examples of low molecular weight compounds having two or more carboxyl groups are phthalic acid, isophtalic acid, terephthalic acid, 1,2,4,5-benzenetetracarboxylic acid (pyromellitic acid), 1,3,5-benzenetricarboxylic acid (trimethine acid), 1,2,4-benzenetricarboxylic acid (trimellitic acid), adipic acid, maleic acid, butane tetracarboxylic acid, tris (2-carboxyethyl) isocyanuric acid, naphthalene-2-carboxylic acid, naphthalene-2,6-dicarboxylic acid, pamoic acid, 1,1'-binaphtalene-2,2'-dicarboxylic acid, anthracene-9,10-dicarboxylic acid, itaconic acid, glutaric acid, 1,2-cyclohexanedicarboxylic acid, 1,2,3,4-cyclopentanetetracarboxylic acid, biphenyl-2,2-dicarboxylic acid (diphenic acid), butane-1,4-dicarboxylic acid, butane tetracarboxylic acid, 1,4-cyclohexanedicarboxylic acid, 1,2,3,4-cyclopentane tetracarboxylic acid, 3,3-dimethylcyclopropane-1,2-dicarboxylic acid, cis-1,2,2-trimethylcyclopentane-1,3-dicarboxylic acid, 1,4,5,6,7,7-hexachlorobicyclo[2.2.1]-5-heptene-2,3-dicarboxylic acid, acetonedicaboxylic acid, and 4,4'-biphenyldicarboxylic acid, etc. It is preferred that the compound having two or more protected carboxyl groups of formula (1) produced from these compounds has a molecular weight of 200 or more. If the molecular weight of the compound is less than 200, it may cause a problem that the compound sublimates during baking for forming the underlayer coating. The molecular weight is for example 200 to 2000, 250 to 1500, 300 to 1000, or 400 to 800. For providing a strong underlayer coating, the compound having protected carboxyl groups of formula (1) needs to have two or more protected carboxyl groups that act as reactive positions on forming the underlayer coating. It is preferred to use a compound having from 2 to 6, or 3 to 4 protected carboxyl groups of formula (1).

As the compound having two or more protected carboxyl groups of formula (1), the compound of formula (4) can also be used. In formula (4), X is hydrogen atom, $C_{1-10}$ alkyl group, $C_{1-10}$ alkoxy group, nitro group, cyano group, or halogen group, m is an integer of 2 to 6, n is an integer of 0 to 4, m and n satisfy a relation of m+n=6, and when n is 2 or more, Xs are identical with or different from each other. The molecular weight of the compound of formula (4) is for example 200 to 2000, or 1500 or less, for example 250 to 1500, 300 to 1000, or 400 to 800.

Examples of $C_{1-10}$ alkyl group are methyl group, ethyl group, n-butyl group, n-octyl group, isopropyl group, tert-butyl group, 2-ethylhexyl group, and cyclohexyl group, etc. Examples of $C_{1-10}$ alkoxy group are methoxy group, ethoxy group, n-butoxy group, n-octyloxy group, isopropoxy group, tert-butoxy group, 2-ethylhexyloxy group, and cyclohexyloxy group, etc. The halogen groups are fluoro group, chloro group, bromo group, iodo group.

The compound of formula (4) can be produced by reacting a corresponding carboxylic acid compound with the compound of formula (5).

Examples of the carboxylic acid compound used in producing the compound of formula (4) are phthalic acid, isophthalic acid, terephthalic acid, 1,2,4,5-benzenetetracarboxylic acid, 1,3,5-benzenetricarboxylic acid, 1,2,4-benzenetricarboxylic acid, 1,2,3-benzenetricarboxylic acid (hemimellitic acid), 1,2,3,4-benzenetetracarboxylic acid (mellophanic acid), 1,2,3,5-benzenetetracarboxylic acid (prehnitic acid), benzenehexacarboxylic acid (mellitic acid), and the like.

As the compound having two or more protected carboxyl groups of formula (1), an isocyanuric acid compound having from 2 to 3 protected carboxyl groups of formula (1) can also be used. The isocyanuric acid compound can be produced by reacting an isocyanuric acid compound having from 2 to 3 carboxyl groups, such as tris(2-carboxyethyl) isocyanuric acid, bis(2-carboxyethyl) isocyanuric acid, tris (2-carboxybutyl) isocyanuric acid, bis(2-carboxypropyl) isocyanuric acid, bis (2-carboxybutyl) isocyanuric acid, 1,3,5-friazine-1,3,5(2H, 4H, 6H)-triacetic acid-2,4,6-trioxo-α, α', α"-tris(2-oxo-2-phenylethyl), 1,3,5-triazine-1,3,5(2H,4H,6H)-triacetic acid-2,4,6-trioxo-α, α', α"-tris[2-(4-methylphenyl)-2-oxoethyl], 1,3,5-triazine-1,3,5(2H,4H,6H)-triacetic acid-2,4,6-trioxo-α, α', α"-tris([2-(1,2,3,4-tetrahydro-2-naphthalenyl)-2-oxoethyl], 1,2-benzene dicarboxylic acid-[dihydro-5-hydroxymethyl-2,4,6-trioxo-1,3,5-triazine-1,3(2H,4H)-diyl] bis(methylene) ester, and 2-butene diacid-[dihydro-2,4,6-trioxo-1,3,5-triazine-1,3 (2H,4H)-diyl] bis (methylene) ester, etc., with the compound of formula (5).

As the compound having carboxyl groups that is reacted with the vinyl ether compound of formula (5), a polymer having two or more protected carboxyl groups can be also mentioned. The polymers are not specifically limited and include for example polymers containing as structural units, addition polymerizable monomers having a carboxyl group such as acrylic acid, methacrylic acid, vinyl benzoic acid, and maleic acid, etc. Further examples of such polymers are homopolymers such as polyacrylic acid and polymethacrylic acid, etc, copolymer of acrylic acid and methacrylic acid, copolymer of acrylic acid and vinyl benzoic acid, copolymer of methacrylic acid and vinyl benzoic acid, copolymer of methacrylic acid and maleic acid, etc.

The polymer can be produced by reacting the above-mentioned addition polymerizable monomers having carboxyl group with another addition polymerizable monomers such as acrylic acid ester compound, methacrylic acid ester compound, acrylamide compound, methacrylamide compound, vinyl compound, styrene compound, maleimide compound, maleic anhydride, and acrylonitrile, etc. Examples of the polymers are copolymer of acrylic acid and a methacrylic acid ester compound, copolymer of acrylic acid and an acrylamide compound, copolymer of methacrylic acid and a methacrylic acid ester compound, copolymer of methacrylic acid and an acrylic acid ester compound, copolymer of acrylic acid and an acrylic acid ester compound, copolymer of methacrylic acid and a styrene compound, copolymer of acrylic acid and a vinyl compound, copolymer of vinyl benzoic acid and a methacrylic acid compound, copolymer of maleic acid and a methacrylic acid ester compound, and a copolymer of maleic acid and a maleimide compound, etc. Further, polymers having two or more protected carboxyl groups of formula (1) can be produced by reacting the polymer having two or more carboxyl groups with the compound of formula (5).

Examples of acrylic acid ester compounds are, methyl acrylate, ethyl acrylate, isopropyl acrylate, benzyl acrylate, naphthyl acrylate, anthryl acrylate, anthrylmethyl acrylate, phenylacrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethyleneglycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, 5-acryloyloxy-6-hydroxynorbornene-2-carboxylic-6-lactone, and the like.

Examples of methacrylic acid ester compounds are ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methylacrylate, isobutyl methacrylate, 2-ethylhexyl methacrylate, isodecyl methacrylate, n-lauryl methacrylate, n-stearyl methacrylate, methoxy diethylene glycol methacrylate, methoxy polyethylene glycol methacrylate, tetrahydro furfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbomene-2-carboxylic-6-lactone, 2,2,3,3,4,4,4-heptafluorobutyl methacrylate, and the like.

Examples of acrylamide compounds are acrylamide, N-methyl acrylamide, N-ethyl acrylamide, N-benzyl acrylamide, N-phenyl acrylamide, N,N-dimethyl acrylamide, and the like.

Examples of methacrylamide compounds are methacrylamide, N-methyl methacrylamide, N-ethyl methacrylamide, N-benzyl methacrylamide, N-phenyl methacrylamide, N,N-dimethyl methacrylamide, and the like.

Examples of vinyl compounds are vinyl ether, methyl vinyl ether, benzyl vinyl ether, 2-hydroxyethyl vinyl ether, phenyl vinyl ether, propyl vinyl ether, and the like.

Examples of styrene compounds are styrene, methyl styrene, chloro styrene, bromo styrene, hydroxy styrene, and the like.

Examples of maleimide compounds are maleimide, N-methyl maleimide, N-phenyl maleimide, and N-cyclohexyl maleimide, and the like.

As the compound having two or more protected carboxyl groups of formula (1) in the underlayer coating forming composition for lithography of the present invention, a polymer having a structural unit of formula (2), (6), or (7) can be used.

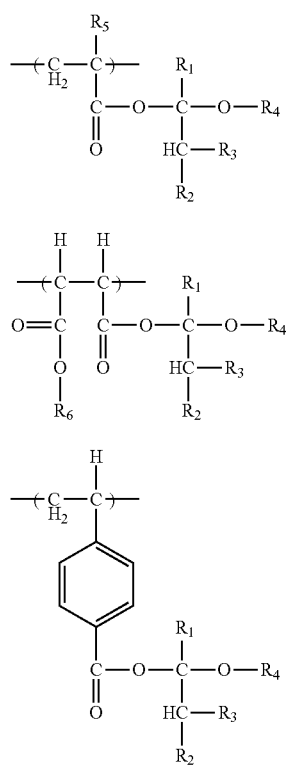

In formula (2), $R_1$, $R_2$, $R_3$, and $R_4$ are as defined in formula (1), $R_5$ is hydrogen atom or methyl group. In formula (6), $R_6$ is $C_{1-10}$ alkyl group. The polymer having the structural unit of formula (2), (6), or (7) can be produced by reacting respective polymer containig the structural unit having a carboxyl group corresponding to formula (2), (6), or (7), with a vinyl ether compound of formula (5). The polymers can be produced by reacting a polymer having addition polymerizable monomers as the structural unit, such as acrylic acid, metacrylic acid, vinyl benzoic acid, maleic acid monoester, with a vinyl ether compound of formula (5). As the polymers having the structural unit of formula (2), (6), or (7), polymers having the structural unit of formula (2), (6), or (7) in a proportion of more than 0.01 or more, 0.1 or more, or 0.35 or more based on the total number of repeating structural units constituting the polymer are preferable. The polymers having the structural unit of formula (2), (6), or (7) in a proportion of 0.01 to 1, or 0.1 to 0.9, or 0.2 to 0.08, or 0.3 to 0.07, or 0.4 to 0.6 based on the total number of repeating structural units constituting the polymer are preferable.

The polymers having the structural unit of formula (2), (6), or (7) can also be produced by polymerization reaction by using addition polymerizable monomers of formula (8), (9), or (10), respectively.

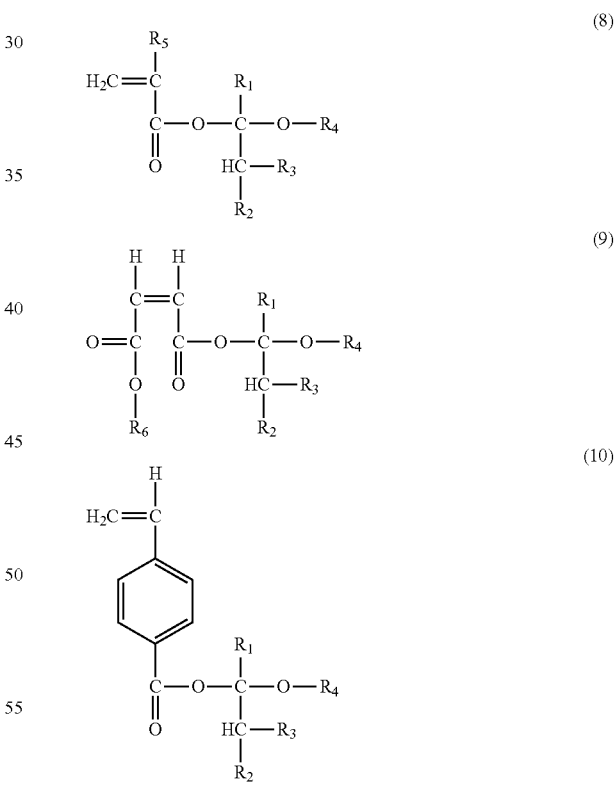

Examples of such addition polymerizable monomers are methacrylic acid hemiacetal ester compounds such as 1-methoxyethyl methacrylate, 1-ethoxyethyl methacrylate, 1-isopropoxyethyl methacrylate, 1-n-hexyloxyethyl methacrylate, and tetrahydro-2H-pyran-2-yl-methacrylate, etc; acrylic acid hemiacetal ester compounds such as 1-methoxyethyl acrylate, 1-tert-butoxyethyl acrylate, 1-isopropoxyethyl acrylate, 1-n-butoxyethyl acrylate, tetrahydro-2H- pyran-2-yl-acrylate, etc; 1-ethoxyethyl-4-vinylbenzoate, and methyl (1-ethoxyethyl) maleate, and the like.

The monomers of formulae (8) to (10) can be produced by reacting acrylic acid, methacrylic acid, vinyl benzoic acid, or maleic acid monoester with the vinyl ether compound of formula (5).

Upon production of the polymer containing the structural unit of formula (2), (6), or (7), the monomers of formulae (8) to (10) are either applied, solely or in combination of two or more kinds.

Upon production of the polymers having the structural unit of formula (2), (6), or (7), other addition polymerizable monomers other than the monomers of formulae (8) to (10) can be also used together. As mentioned, examples of such addition polymerizable monomers are acrylic acid ester compound, methacrylic acid ester compound, acrylamide compound, methacrylamide compound, vinyl compound, styrene compound, maleimide compound, maleic anhydride, and acrylonitrile, and the like.

The polymers by use of the addition polymerizable monomer can be produced by dissolving in addition polymerizable monomer and optionally a chain transfer agent (10% or less based on the mass of the monomer) in an organic solvent, then adding a polymerization initiator to conduct a polymerization reaction and then adding a short-stop. The added amount of the polymerization initiator is 1 to 10 mass % based on the mass of the monomer, and the added amount of the short-stop is 0.01 to 0.2 mass %. The used organic solvent includes propylene glycol monomethyl ether, propylene glycol monopropyl ether, ethyl lactate, and dimethylformamide, etc., the chain transfer agent includes dodecane thiol and dodecyl thiol, etc., the polymerization initiator includes azobisisobutyronitrile and azobiscyclohexane carbonitrile, etc., and the short-stop includes 4-methoxyphenol, etc. The reaction temperature and the reaction time are suitably selected from 30 to 100° C. and 1 and 24 hours, respectively.

In the production of the polymer having the structural units of formula (2), (6), or (7), when the monomer of formulae (8) to (10) and other addition polymerizable monomers are used, the use proportion of these monomers shown in monomer having protected carboxyl groups of formula (1)/other addition polymerizable monomer, is for example 100/1 to 1/100, or 50/1 to 1/50, or 10/1 to 1/10, preferably 5/1 to 1/5, or 3/1 to 1/3 in mass ratio.

In the underlayer coating forming composition for lithography of the present invention, if a polymer is used for the compound having two or more protected carboxyl groups of formula (1), the weight average molecular weight of the polymer is for example 1000 to 500000, or for example 1000 to 200000, or 3000 to 150000, or 3000 to 50000.

In the underlayer coating forming composition for lithography of the present invention, the compound having two or more protected carboxyl groups of formula (1) can be used solely or in combination of two or more kinds.

The compound having two or more epoxy groups that is contained in the underlayer coating forming composition for lithography of the present invention, is not specifically limited as long as it is a compound having two or more epoxy groups. A low molecular weight compound having two or more epoxy groups (a compound having a molecular weight of about 2000 or less, but not a polymer), and a polymer having two or more epoxy groups can be mentioned.

Examples of low molecular weight compounds having two or more epoxy groups are 1,4-butanedioldiglycidyl ether, 1,2-epoxy-4-(epoxyethyl)cyclohexane, glyceroltriglycidylether, diethylene glycol diglycidyl ether, 2,6-diglycidyl phenylglycidyl ether, 1,1,3-tris[p-(2,3-epoxypropoxy)phenyl]propane, 1,2-cyclohexandicarboxylic acid diglycidyl ester, 4,4'-methylene bis(N,N-diglycidyl aniline), 3,4-epoxycyclohexylmethyl-3,4-epoxycyclohexanecarboxylate, trimethyrol ethanetriglycidyl ether, triglycidyl-p-aminophenol, tetraglycidylmetaxylenediamine, tetraglycidyldiaminodiphenylmethane, tetraglycidyl-1,3-bisaminomethylcyclohexane, bisphenol-A-diglycidylether, bisphenol-S-diglycidylether, pentaerythritholtetraglycidylether resorcinol diglycidylether, phthalic acid diglycidyl ester, neopentylglycoldiglycidylether, polypropyleneglycoldiglycidylether, tetrabromobisphenol-A-diglycidylether, bisphenolhexafluoroacetonediglycidylether, pentaerythritholdiglycidylether, tris-(2,3-epoxypropyl)isocyanurate, and monoallyildiglycidylisocyanurate, etc. The low molecular weight compound having two or more epoxy groups also includes a compound having two or more glycidylether structures or glycidylester structures that can be produced from a compound having two or more hydroxyl groups or carboxyl groups such as a diol compound, a triol compound, a dicarboxylic acid compound, a tricarboxylic compound, and the like, and a glycidyl compound such as epichlorhydrin.

Preferably, the low molecular weight compound having two or more epoxy groups has a molecular weight of 200 or more. If the molecular weight of the compound is less than 200, there is a possibility of sublimation during the baking process of forming the underlayer coating. Hence, the molecular weight is for example 200 to 2000, or 250 to 1500, or 300 to 1000, or 400 and 800. In order to produce a strong underlayer coating, the compound is required to have at least two epoxy groups that act as reactive positions while forming the underlayer coating. A compound having from 2 to 6, or 3 to 4 epoxy groups is preferred.

The polymers having two or more epoxy groups contained in the underlayer coating forming composition for lithography of the present invention is not specifically limited, and various polymers that have epoxy groups can be used.

Examples of such polymers are polymers produced by addition polymerizable monomers having epoxy group. Further, such polymers include polymers that are produced by combining the addition polymerizable monomers having epoxy group with the above-mentioned other addition polymerizable monomers such as acrylic acid ester compound, methacrylic acid ester compound, acrylamide compound, methacrylamide compound, vinyl compound, styrene compound, maleimide compound, maleic anhydride, and acrylonitrile, etc.

Examples of the addition polymerizable monomers having epoxy group are glycidyl acrylate, and glycidyl methacrylate, etc.

The polymer having two or more epoxy groups includes a polymer having the structure of formula (3) as a structural unit. Such a polymer can be produced by using glycidyl acrylate or glycidyl methacrylate. For example, polyglycidyl acrylate, polyglycidyl methacrylate, and a copolymer of glycidyl acrylate and glycidyl methacrylate can be mentioned. The polymer can be produced by combining glycidyl acrylate or glycidyl methacrylate with other addition polymerizable monomers as mentioned above, such as acrylic acid ester compound, methacrylic acid ester compound, acrylamide compound, methacrylamide compound, vinyl compound, styrene compound, maleimide compound, maleic anhydride, and acrylonitrile, etc. For example, the polymers are copolymer of glycidyl methacrylate and a methacrylic acid ester compound, copolymer of glycidyl methacrylate and an acrylamide compound, copolymer of glycidyl methacrylate and a methacrylic acid ester, copolymer of glycidyl acrylate and an acrylic acid ester compound, copolymer of acrylic acid and an acrylic acid ester compound, copolymer of glycidyl acrylate and a styrene compound, copolymer of glycidyl acrylate and a vinyl compound, copolymer of glycidyl acrylate and a methacrylic acid ester compound, and copolymer of glycidyl acrylate and a maleimide compound, etc.

In the production of the polymer having two or more epoxy groups, when the addition polymerizable monomer having epoxy group and other addition polymerizable monomer are used, the use proportion of these monomers shown in addition polymerizable monomer having epoxy group/other addition polymerizable monomer is for example 100/1 to 1/100, or 50/1 to 1/50, or 10/1 to 1/10, or preferably 5/1 to 1/5, or 3/1 to 1/3 in mass ratio.

The polymer having two or more epoxy groups can be also produced by reacting a polymer having hydroxyl group with a compound having epoxy group such as epichlorhydrine or glycidyltosylate, or the like. Examples of such polymers are epoxyphenol novolak produced from phenol novolak and epichlorhydrine, epoxycresol novolak, and epoxynaphthol novolak, etc.

If a polymer having two or more epoxy groups is used in the underlayer coating forming composition for lithography of the present invention, the weight average molecular weight of the polymer is for example 1000 to 500000, or for example 1000 to 200000, or 3000 to 150000, or 3000 to 50000.

In addition, as the compound having two or more epoxy groups, an epoxy compound that is available in a commercialized product can be used; such as: YH-435, and YH-434L (manufactured by Tohto Kasel Co., Ltd.) as epoxy resin having an amino group; Epo-Lead GT-401, GT-403, GT-301, GT-302, Celoxide 2021, and Celoxide 3000 (manufactured by Daicel Chemical Industries, Ltd.) as epoxy resin having an cyclohexeneoxide structure; Epicoat 1001, 1002, 1003, 1004, 1007, 1009, 1010, 828 (manufactured by Japan Epoxy Resins Co., Ltd.) as bisphenol-A-epoxy resin; Epicoat 807 (manufactured by Japan Epoxy Resins Co., Ltd.) as bisphenol-F-epoxy resin; Epicoat 152, 154 (product of, Japan Epoxy Resins Co., Ltd.), and EPPN 201, 202 (manufactured by Nippon Kayaku Co., Ltd.) as phenol novolak epoxy resin; EOCN-102, EOCN-103S, EOCN-104S, EOCN-1020, EOCN-1025, EOCN-1027 (manufactured by Nippon Kayaku Co., Ltd.), and Epicoat 180S75 (manufactured by Japan Epoxy Resins Co., Ltd.), as cresol novolac epoxy resin; Denacol EX-251 (manufactured by Nagase ChemteX Corporation), CY175, CY177, CY179 (manufactured by CIBA-GEIGY A.G), Araldite CY-182, Araldite CY-192, Araldite CY-184 (manufactured by CIBA-GEIGY A.G), Epiclon 200, 400 (manufactured by Dainippon Ink and Chemicals Incorporated), Epicoat 871, 872 (manufactured by Japan Epoxy Resins Co., Ltd.), and ED-5661, ED5662 (manufactured by Celanese Coatings Company) as alicyclic epoxy resin; and Denacol EX-611, EX-612, EX-614, EX-611, EX-411, EX-512, EX-522, EX-421, EX-313, EX-314, EX-321 (manufactured by Nagase ChemteX Corporation.) as aliphatic polyglycidyl ether. In the underlayer coating forming composition for lithography of the present invention, the compound having two or more epoxy groups can be used solely or in combination of two or more kinds.

In the underlayer coating forming composition for lithography of the present invention, the content proportion of the compound having two or more protected carboxyl groups of formula (1) and the compound having two or more epoxy groups shown in compound having two or more protected carboxyl groups/compound having two or more epoxy groups is for example 20/1 to 1/20, or 10/1 to 1/10, or 5/1 to 1/5, or 3/1 to 1/3, or 2/1 to 1/2, or 3/2 to 2/3 in mass ratio. The polymer having two or more protected carboxyl groups of formula (1) that is contained in the underlayer coating forming composition for lithography of the present invention can be, for example, polymers of formulae (11) to (22). Moreover, the polymer having two or more epoxy groups can be the polymers of formulae (23) to (30) (in the formulae, p, q, and r are a proportion of each structural unit with respect to the total number of structural units constituting the polymer, and the sum thereof is 1).

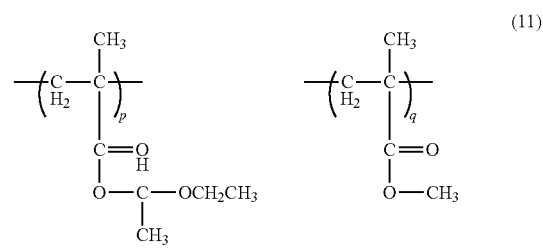

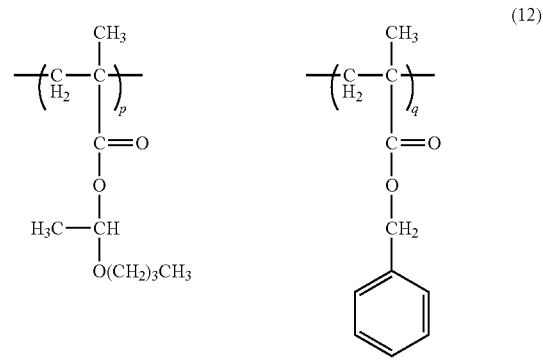

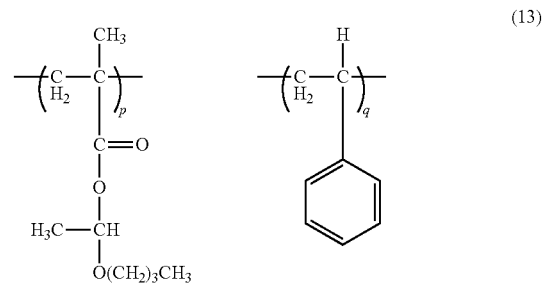

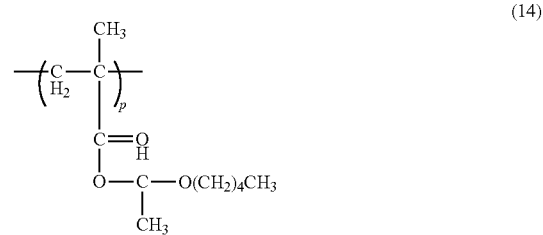

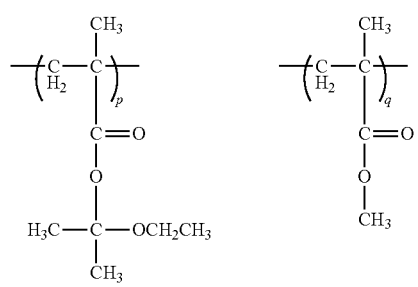 (15)
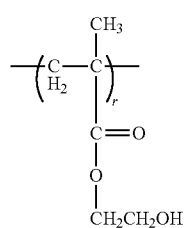 (16)
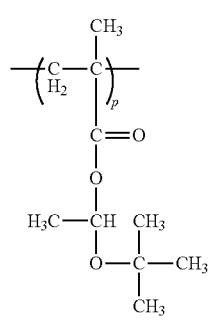
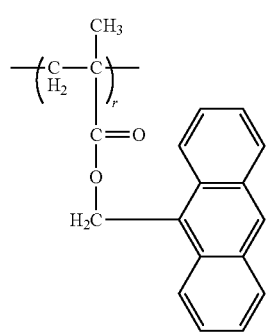
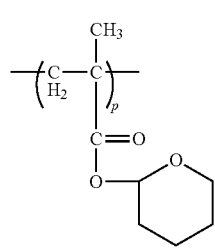 (17)
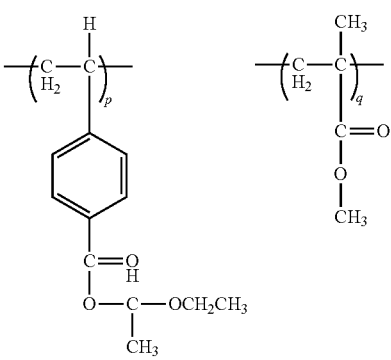 (18)
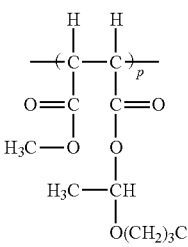 (19)
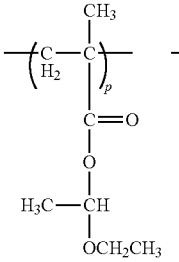 (20)
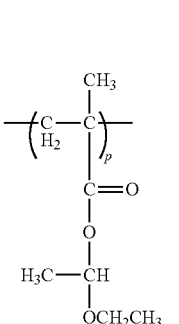 (21)
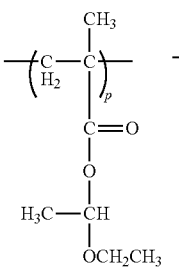 (22)

-continued

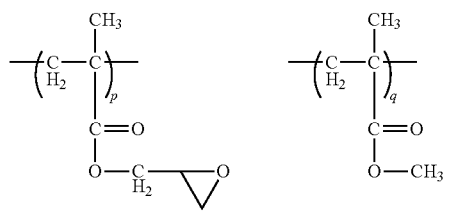
(23)

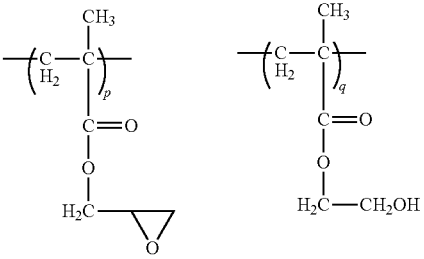
(28)

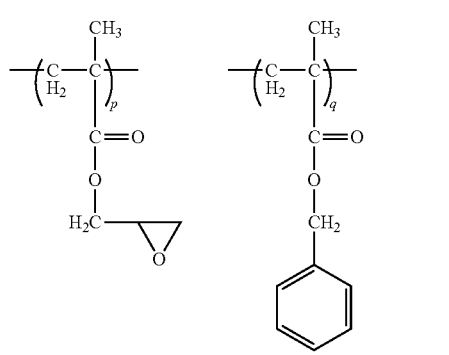
(24)

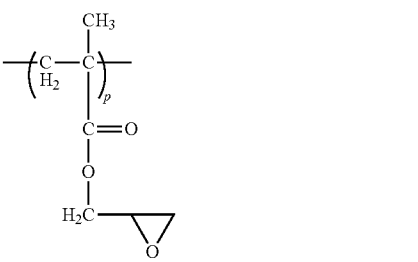
(29)

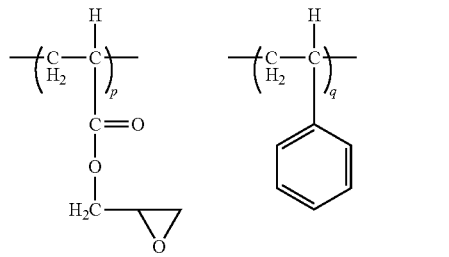
(25)

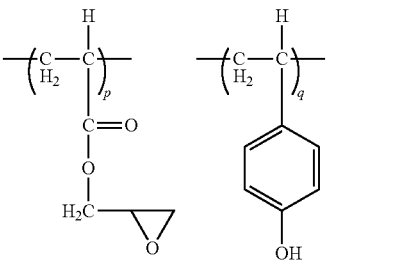
(30)

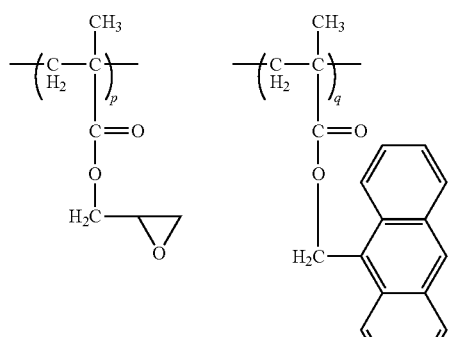
(26)

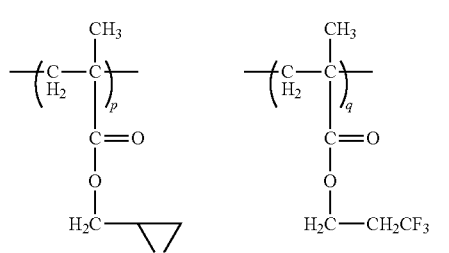
(27)

In the underlayer coating forming composition for lithography of the present invention, light absorbing compounds, surfactants and photoacid generators can be added.

The light absorbing compounds can be used without any limitation so long as they have a high absorption for light at photosensitive characteristic wavelength region of photosensitive components in a photoresist layer provided on the underlayer coating, and prevents standing wave caused by reflection from a substrate or random reflection due to unevenness on substrate surface.

Examples of such light absorbing compounds that can be used are benzophenone compound, benzotriazole compound, azo compound, naphthalene compound, anthracene compound, anthraquinone compound, triazine compound, triazinetrione compound, quinoline compound, and the like. Naphthalene compound, anthracene compound, triazine compound, and triazinetrione compound are used.

Specific examples of such compounds are 1-naphthalene carboxylic acid, 2-naphthalene carboxylic acid, 1-naphthol; 2-naphthol, 1-naphthylacetate, 1-hydroxy-2-naphthalene carboxylic acid, 3-hydroxy-2-naphthalene carboxylic acid, 3,7-dihydroxy-2-naphthalene carboxylic acid, 6-bromo-2-hydroxy naphthalene, 2,6-naphthalene dicarboxylic acid, 9-anthracene carboxylic acid, 10-bromo-9-anthracene carboxylic acid, anthracene-9, 10-dicarboxylic acid, 1-anthracene carboxylic acid, 1-hydroxy anthracene, 1,2,3-anthracenetriol, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, 2,4,6-tribromo-3-hydroxybenzoic acid, and the like. Further examples of the light absorbing compound are a polymer having a benzene ring, a naphthalene ring, or an anthracene ring.

These light-absorbing compounds can be used solely, or in combination of two or more kinds. If the light absorbing compound is contained in the underlayer coating forming composition of the present invention, the added amount thereof is 20 mass % or less, for example 0.1 to 20 mass %, or 1 to 10 mass % in the solid content.

The underlayer coating forming composition for lithography of the present invention may contain surfactants. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (manufactured by Tochem Products Co., Ltd.), MEGAFAC F171, F173 (manufactured by Dainippon Ink and Chemicals, Inc.), FLUORAD FC430, FC431 (manufactured by Sumitomo 3M Limited), ASAHI GUARD AG710, SURFLON S-382, SC101, SC102, SC103, SC104, SC105, SC106 (manufactured by Asahi Glass Co., Ltd.); organosiloxane polymer KP341 (manufactured by Shin-etsu Chemical Co., Ltd.), etc. The blending amount of the surfactants is usually 0.2 mass % or less, preferably 0.1 mass % or less in all components of the underlayer coating forming composition according to the present invention. The surfactants may be added solely, or in combination of two or more kinds.

In the underlayer coating forming composition for lithography according to the present invention, a photoacid generator can be added in order to conform the acidity of an underlayer coating to that of a photoresist provided on the underlayer coating in lithography process. The photoacid generator includes onium salt compounds, sulfone imide compounds, and disulfinyl diazomethane compounds, etc. The onium salt compounds include iodonium salt compounds such as diphenyl iodonium hexafluorophosphate, diphenyl iodonium trifluoromethane sulfonate, diphenyl iodonium nonafluoro-n-butane sulfonate, diphenyl iodonium perfluoro-n-octane sulfonate, diphenyliodonium camphor sulfonate, bis(4-t-butylphenyl(iodonium camphor sulfonate and bis(4-tert-butylphenyl)iodonium trifluoromethane sulfonate, etc., and sulfonium salt compounds such as triphenylsulfonium hexafluoroantimonate, triphenylsulfonium nonafluororo-n-butane sulfonate, triphenylsulfonium camphor sulfonate and triphenylsulfonium trifluoromethane sulfonate, etc.

The sulfone imide compounds include for example N-(trifluoromethane sulfonyloxy)succinimide, N-(nonafluoro-n-butanesulfonyloxy)succinimide, N-(camphorsulfonyloxy) succinimide and N-(trifluoromethanesulfonyloxy) naphthalimide, etc.

The disulfonyl diazomethane compounds include for example bis(trifluoromethylsulfonyl)diazomethane, bis(cyclohexylsulfonyl)diazomethane, bis(phenylsulfonyl)diazomethane, bis(p-toluene)sulfonyldiazomethane, bis(2,4-dimethylbenzenesulfonyl)diazomethane, and methylsulfonyl-p-toluenesulfonyl diazomethane, etc.

These photoacid generators can be used solely, or in a combination of two or more kinds. When the photoacid generator is used, the content amount thereof is 20 mass % or less, 0.01 to 10 mass %, or 0.1 to 5 mass %, or 0.5 to 3 mass % in the solid content of the underlayer coating forming composition.

The underlayer coating forming composition according to the present invention may contain rheology controlling agents, adhesion auxiliaries, etc., if necessary. The rheology controlling agent improves fluidity of the underlayer coating forming composition, and particularly in baking step, is effective for improving filling property of the underlayer coating forming composition into holes. The adhesion auxiliary improves adhesion between the semiconductor substrate or photoresist and the underlayer coating, and is effective for particularly in developing step, preventing the photoresist from being exfoliated.

There are no limitations in the solvents used in the underlayer coating forming composition for lithography of the present invention, as far as the solvents can dissolve the above-mentioned solid contents.

Examples of such solvents are, methyl cellosolve acetate, ethyl cellosolve acetate, propylene glycol, propylene glycol monethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butylate, ethyl butylate, propyl butylate, isopropyl butylate, butyl butylate, isobutyl butylate, ethyl hydroxy acetate, ethyl 2-hydroxy-2-methylpropionate, methyl 3-methoxy-2-methylpropionate, methyl 2-hydroxy-3-methylbutylate, ethyl methoxy acetate, ethyl ethoxy acetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butylate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, γ-butylolactone. These solvents may be used solely or in combination of two or more kinds.

Hereinafter, the use of the underlayer coating forming composition of the present invention is explained.

The underlayer coating forming composition for lithography of the present invention is coated by a suitable coating method, for example, with a spinner, a coater or the like, onto a semiconductor substrate (for example silicon/silicon dioxide coated substrate, silicon wafer substrate, silicon nitride substrate, glass substrate, ITO substrate or the like), and thenafter, the substrate is baked to form an underlayer coating. The baking condition is selected from a temperature ranging from 80 to 250° C., and time ranging from 0.3 to 60 minutes. Preferably, the baking temperature is 130 to 250° C., and the baking time is 0.5 to 5 minutes. The thickness of formed underlayer coating is, for example 0.01 to 3.0 µm, or for example 0.03 to 1.0 µm, or 0.05 to 0.50 µm.

As mentioned above, the underlayer coating forming composition for lithography of the present invention contains a compound having protected carboxyl groups of formula (1), and compound having epoxy groups.

When the composition is applied on the substrate, baked, and form an underlayer coating, it is considered the protected carboxyl group of formula (1) is decomposed by heat, and provides a carboxyl group (formula (EQ1) that reacts with the epoxy group during the baking process (formula (EQ2), and by this reaction, the compounds contained in the underlayer coating forming composition are bonded each other.

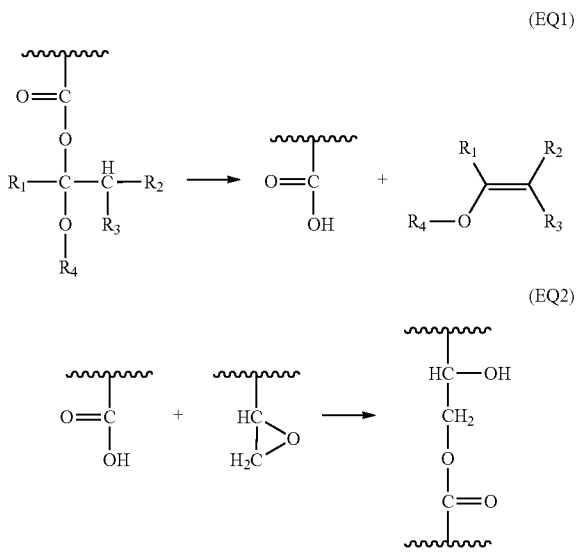

Specifically, in the underlayer coating forming composition for lithography of the present invention, a compound having two or more protected carboxyl groups of formula (1) and a compound having two or more epoxy groups are used. Therefore, by the reaction of the carboxyl group and the epoxy group, the compounds are continuously bonded, and such continuous bonds can provide a strong underlayer coating. As a result, the underlayer coating becomes low in solubility in an organic solvent generally used for photoresist composition applied on the underlayer coating, for example, ethylene glycol monomethyl ether, ethyl cellosolve acetate, diethylene glycol monomethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxy acetate, methyl pyruvate, ethyl lactate, butyl lactate, and the like. Therefore, an underlayer coating formed by the underlayer coating forming composition for lithography of the present invention do not intermix with the photoresist. It is assumed that if a compound having many reactive positions is used, the underlayer coating will become stronger. Further, it is assumed that if polymers are used for the compound having protected carboxyl groups of formula (1) or the compound having epoxy groups, the underlayer coating become stronger by the crosslinking structure formed by a reaction in baking step. It is therefore preferred in the underlayer coating forming composition of the present invention to use a polymer having carboxyl groups of formula (1) or a polymer having epoxy groups. Furthermore, no catalyst is required as the formation of carboxyl group by the thermal decomposition of protected carboxyl groups of formula (1), and the reaction between the formed carboxyl group and epoxy group smoothly proceed under the baking condition. Therefore, the underlayer coating forming composition for lithography of the present invention does not require a crosslinking catalyst such as an acid compound that has been contained in the conventional compositions for forming crosslinking underlayer coatings. Therefore, the underlayer coating forming composition for lithography of the present invention is excellent in storage stability.

Next, a photoresist is formed on the underlayer coating. The photoresist layer is formed by the known method, namely, by applying a photoresist composition solution onto the underlayer coating, and by heating. The photoresist to be coated and formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shin-etsu Chemical Co., Ltd., and the like can be mentioned.

Subsequently, exposure to light is carried out through a predetermined mask. For the exposure to light, KrF excimer laser (wavelength of 248 nm), ArF excimer laser (wavelength of 193 nm), and F2 excimer laser beam (wavelength 157 nm), may be used. If necessary, a post exposure bake (PEB) may be performed after being exposed to light. The post exposure bake is conducted by suitably selecting from heating temperature of 70 to 150° C., and a heating time of 0.3 to 10 minutes.

In the next phase, development is carried out by using developer for photoresist. For example, in case where a positive type photoresist is used, the development results in removal of exposed part of the photoresist and forming of photoresist pattern.

The developer for photoresist includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. Additionally, surfactants can be added in the developer. The condition in which development takes place is suitably selected from a temperature ranging from 5 to 50° C. and time ranging from 10 to 300 seconds.

Then, the removal of the underlayer coating and processing of the semiconductor substrate are conducted by using the photoresist pattern formed as mentioned above as a protective coating. The removal of the underlayer is conducted through dry etching by use of a gas such as tetrafluoromethane, perfluorocyclobutane ($C_4F_B$), perfluoropropane ($C_3F_B$), trifluoromethane, carbon monoxide, argon, oxygen, nitrogen, sulfur hexafluoride, difluoromethane, nitrogen trifluoride, and chlorine trifluoride, etc.

An organic anti-reflective coating layer can be applied before or after forming the underlayer coating of the present invention onto the semiconductor substrate. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a polymer and a solvent, one containing as main components a polymer having a light absorbing group through chemical bond, a crosslinking agent and a solvent, one containing as main components a light absorbing compound a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The polymers include polyesters, polyimides, polystyrenes, novolak resins, polyacetals, acrylic polymers, and the like. The polymers having a light absorbing group through chemical bond include polymers having a light absorbing aromatic ring structure such as anthracene ring, naphthalene ring, benzene ring, quinoline ring, quinoxaline ring or thiazole ring, and the like.

The semiconductor substrates on which the underlayer coating forming composition of the present invention is applied may be substrates having an inorganic anti-reflective coating formed by CVD methods, or the like, and the underlayer coating of the present invention can be formed thereto.

The underlayer coating formed by the underlayer coating forming composition of the present invention may have absorption for light used in the process of lithography. In such a case, the underlayer coating can be used as a layer that provides preventive effect towards the light reflected by the substrate, that is, as an anti-reflective coating.

The underlayer coating of the present invention can be used further as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, and as a barrier layer for reducing any poisoning effect of the photoresist layer by the semiconductor substrate dielectric layer, and the like.

Still further, the underlayer coating formed from the underlayer coating forming composition for lithography of the present invention can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Synthesis Example 1

In 152.7 g of ethyl lactate, 10.00 g of glycidylmethacrylate and 28.16 g of methyl methacrylate were dissolved, and nitrogen was flowed in the solution for 30 minutes, the solution was then heated up to 70° C. While keeping the reaction solution at 70° C., 0.763 g of azobisisobutyronitrile and 0.763 g of 1-dodecane thiol were added to the reaction solution. After stirring the solution at 70° C. for 8 hours under nitrogen atmosphere, 0.1 g of 4-methoxyphenol was added to obtain a solution containing a copolymer of glycidylmethacrylate and methylmethacrylate. The obtained copolymer was analyzed by GPC method, and the number average molecular weight (Mn) of the copolymer was 2400, and the weight average molecular weight (Mw) (in terms of standard polystyrene) of the copolymer was 6900.

Synthesis Example 2

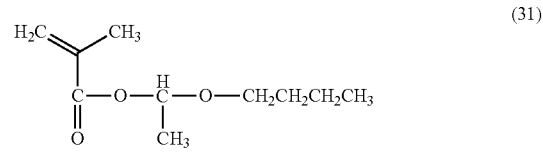

(31)

In 126.9 g of ethyl lactate, 10.0 g of 1-butoxyethyl methacrylate of formula (31) (a product of Honsyu Chemical Industry Co., Ltd.) and 21.73 g of methyl methacrylate were dissolved, nitrogen was flowed in the solution for 30 minutes, and the reaction solution was heated to 70° C. While keeping the reaction solution at 70° C., 0.635 g of azobisisobutyronitrile and 0.635 g of 1-dodecane thiol were added to the reaction solution. After stirring the solution at 70° C. for 8 hours under nitrogen atmosphere, 0.1 g of 4-methoxy phenol was added to obtain a solution containing a copolymer of 1-butoxyethyl methacrylate and methyl methacrylate. The obtained copolymer was analyzed by GPC method, and the number average molecular weight (Mn) of the copolymer was 2000, and the weight average molecular weight (Mw) (in terms of standard polystyrene) of the copolymer was 5600.

Synthesis Example 3

In 14.4 g of methyl ethyl ketone, 5.00 g of 1,2,4,5-benzenetetracarboxylic acid (a product of Wako Pure Chemical Industries, Ltd.) and 9.46 g of n-butyl vinyl ether were dissolved, 0.015 g of phosphoric acid was added as a catalyst, and the reaction solution was stirred at 80° C. for 8 hours under nitrogen atmosphere. The solvent was distilled off to obtain 1,2,4,5-benzene tetracarboxylic acid-tetrakis(1-butoxyethyl) ester (formula (32)).

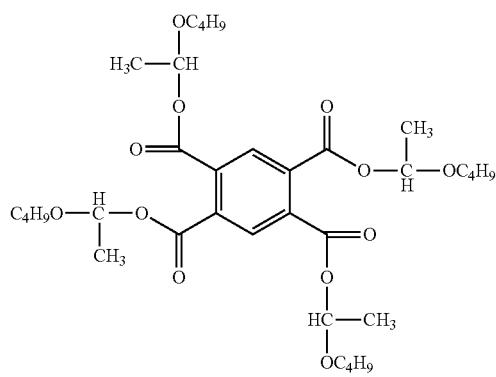

(32)

Synthesis Example 4

In 13.6 g of methyl ethyl ketone, 5.00 g of 1,3,5-benzenecarboxylic acid (a product of Wako Pure Chemical Industries, Ltd.) and 8.58 g of n-butyl vinyl ether were dissolved, 0.014 g of phosphoric acid was added as a catalyst, and the solution was stirred at 80° C. for 8 hours under nitrogen atmosphere. The solvent was distilled off to obtain 1,3,5-benzene tricarboxylic acid-tris(1-butoxyethyl) ester.

Synthesis Example 5

In 10.8 g of methyl ethyl ketone, 5.00 g of tris(2-carboxyethyl)isocyanuric acid (a product of Shikoku Chemicals Corporation) and 5.83 g of n-butyl vinyl ether were dissolved, 0.011 g of phosphoric acid was added as a catalyst, and the solution was stirred at 80° C. for 8 hours under nitrogen atmosphere. The solvent was distilled off to obtain tris(2-(1-butoxyl)ethyloxycarbonyl) isocyanuric acid (formula (33)).

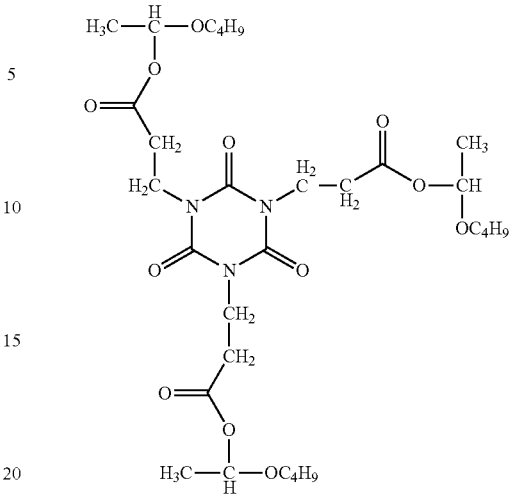

(33)

Example 1

In 10.0 g of the solution containing a copolymer of glycidyl methacrylate and methyl methacrylate that was obtained in Synthesis Example 1 (solid content concentration: 20 mass %), 4.75 g of propylene glycol monomethyl ether, 3.08 g of ethyl lactate, 0.460 g of 1,2,4,5-benzene tetracarboxylic acid-tetrakis (1-butoxyethyl) ester that was obtained in Synthesis Example 3, and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 μm to prepare a solution of underlayer coating forming composition for lithography.

Example 2

In 10.0 g of the solution containing a copolymer of glycidyl methacrylate and methyl methacrylate that was obtained in Synthesis Example 1 (solid content concentration: 20 mass %), 4.75 g of propylene glycol monomethyl ether, 3.08 g of ethyl lactate, 0.460 g of 1,3,5-benzene tricarboxylic acid-tris (1-butoxyethyl) ester that was obtained in Synthesis Example 4, and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 μm to prepare a solution of underlayer coating forming composition.

Example 3

In 10.0 g of the solution containing a copolymer of glycidyl methacrylates and methyl methacrylate that was obtained in Synthesis Example 1 (solid content concentration: 20 mass %), 4.75 g of propylene glycol monomethyl ether, 3.08 g of ethyl lactate, 0.460 g of tris(2-(1-butoxy)ethyl oxy carbonyl)isocyanuric acid that was obtained in Synthesis Example 5, and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

Example 4

In 10.0 g of the solution containing a copolymer of glycidyl methacrylate and methyl methacrylate that was obtained in Synthesis Example 1 (solid content concentration: 20 mass %), 10.0 g of the solution containing a copolymer of 1-butoxyethyl methacrylate and methyl methacrylate that was obtained in Synthesis Example 2 (solid content concentration: 20 mass %), 7.71 g of propylene glycol monomethyl ether, 1.99 g of ethyl lactate, and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

Example 5

In 10.0 g of the solution containing a copolymer of 1-butoxyethyl methacrylate and methyl methacrylate that was obtained in Synthesis Example 2 (solid content concentration: 20 mass %), 4.75 g of propylene glycol monomethyl ether, 3.08 g of ethyl lactate, 0.460 g of 4,4'-methylene bis(N,N-diglycidyl aniline) (manufactured by Thoto Kasel Co., Ltd., trade name: YH434L), and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

Example 6

In 10.0 g of the solution containing a copolymer of 1-butoxethyl methacrylate and methyl methacrylate that was obtained in Synthesis Example 2 (solid content concentration: 20 mass %), 5.21 g of propylene glycol monomethyl ether, 4.16 g of ethyl lactate, 0.70 g of 1,2,3,4-butane tetracarboxylic acid-tetrakis(5-(3,4-epoxy)cyclohexylmethyloxycarbonyl) n-pentyl)ester (formula (34), manufactured by Daicel Chemical Industries Ltd., trade name: GT401), and 0.10 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

(34)

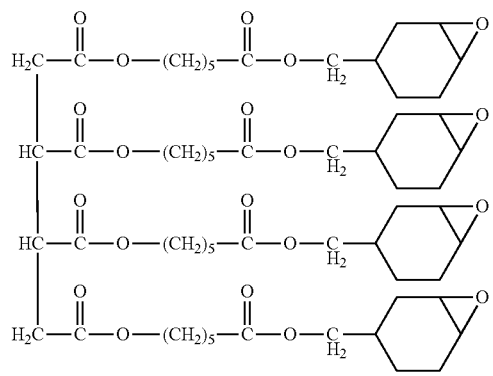

Example 7

In 10.0 g of the solution containing a copolymer of 1-butoxyethyl methacrylate and methyl methacrylate that was obtained in Synthesis Example 2 (solid content concentration: 20 mass %), 5.21 g of propylene glycol monomethyl ether, 4.16 g of ethyl lactate, 0.70 g of penta-erythritol tetraglycidyl ether (formula (35), manufactured by Nagase ChemeteX Co., Ltd., EX411), and 0.10 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

(35)

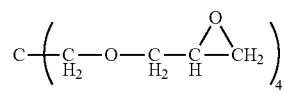

Example 8

In 2.00 g of 1,2,4,5-benzene tetracarboxylic acid-tetrakis (1-butoxyethyl) ester that was obtained in Synthesis Example 3, 7.71 g of propylene glycol monomethyl ether, 18.0 g of ethyl lactate, 2.00 g of 1,2,3,4-butane tetracarboxylic acid-tetrakis(5-(3,4-epoxy)cyclohexylmethyloxycarbonyl) n-pentyl)ester (manufactured by Daicel Chemical Industries Ltd., trade name: GT401), and 0.010 g of surfactant R-30 (manufactured by Dainippon Ink and Chemicals Incorporated) were added to prepare a solution of 13.5 mass %. Then, the solution was filtered through a micro filter made of polyethylene having a pore size of 0.05 µm to prepare a solution of underlayer coating forming composition.

Dissolution Test in Photoresist Solvent

The solutions of underlayer coating forming compositions for lithography that were obtained in Examples 1 to 8 were coated on silicon wafer substrates by means of a spinner, respectively. The coated silicon wafer substrates were baked at 205° C. for 1 minute on a hot plate to form underlayer coatings (film thickness 0.45 µm). The underlayer coatings were dipped in ethyl lactate being a solvent used for photoresists, and as a result it was confirmed that the resulting underlayer coatings were insoluble in this solvent.

Test of Intermixing with Photoresist

The solutions of underlayer coating forming compositions that were obtained in Examples 1 to 8 were coated on silicon wafer substrates by means of a spinner, respectively. The coated silicon wafer substrates were baked at 205° C. for 1 minute on a hot plate to form underlayer coatings (film thickness 0.45 µm). On each underlayer coating was coated a commercially available photoresist solution (trade name: GARS 8105G1 manufactured by Fuji Photo Film Co., Ltd. and trade name: SEPR 430 manufactured by Shin-etsu Chemical Co., Ltd.) by means of a spinner. The coated wafers were heated at 90° C. or 110° C. for 1.5 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresist layers.

Tests of Flattening Rate and Filling Property

The solutions of underlayer coating forming compositions that were obtained in Examples 1 to 8 were coated on silicon dioxide ($SiO_2$) wafer substrates having holes (diameter: 0.18 μm) by means of a spinner, respectively. The used substrates were substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole. The depth of the holes is 1.0 μm and the diameter thereof is 0.18 μm. The coated substrates were baked at 205° C. for 1 minute on a hot plate to form underlayer coatings. The thickness of coating thereof was 0.50 μm at the open area where hole pattern is not present in the vicinity. The flattening rate by the underlayer coatings was assessed by observing the sectional form of the substrates with a scanning electron microscope (SEM). The flattening rate was calculated according to the following equation. The flattening rate was 100% when holes on the substrate were perfectly flattened.

Flattening Rate=[1−(dimple depth $a$ of underlayer coating at the center of holes)/(hole depth $b$)]×100

In addition, no void (gap) was observed inside the holes, and it was observed that the inside of the holes was filled with the underlayer coating.

TABLE 1

| | Film Thickness (nm) | | | Flattening Rate (%) | | |
|---|---|---|---|---|---|---|
| | Iso | Dense | Bias | Iso | Dense | Bias |
| Example 1 | 450 | 380 | 70 | 100 | 100 | 0 |
| Example 2 | 440 | 380 | 60 | 100 | 100 | 0 |
| Example 3 | 450 | 370 | 80 | 100 | 100 | 0 |
| Example 4 | 460 | 370 | 90 | 100 | 100 | 0 |
| Example 5 | 440 | 380 | 60 | 100 | 100 | 0 |
| Example 6 | 440 | 360 | 80 | 100 | 100 | 0 |
| Example 7 | 450 | 360 | 90 | 100 | 100 | 0 |
| Example 8 | 450 | 370 | 80 | 100 | 100 | 0 |

In the underlayer coatings of Examples 1 to 8, difference (Bias) in film thickness on Iso (isolated) and Dense (dense) patterns was small. The underlayer coatings of Examples 1 to 8 were excellent in flowability on fine Dense hole pattern that it was particularly difficult to obtain a constant film thickness. It is assumed that the solution of the underlayer coating forming composition smoothly flows into a plurality of holes even at Dense part having larger hole number (hole density) per unit area on the substrate than Iso part, thereby providing constant film thickness, and that consequently difference in film thickness of Iso part and Dense part becomes small and flattening rate becomes high. Further, the underlayer coating forming compositions of Examples 1 to 8 were able to flatten irrespective of Iso part and Dense part.

Measurements of Optical Parameters

The solution of underlayer coating forming composition that was obtained in Example 1 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.64 and attenuation coefficient (k) was 0.04. The solution of underlayer coating forming composition that was obtained in Example 2 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.64 and attenuation coefficient (k) was 0.03.

Measurement of Dry Etching Rate

The solutions of underlayer coating forming compositions that were obtained in Examples 1 to 8 were coated on silicon wafer substrates by means of a spinner, respectively. The coated silicon wafer substrates were baked at 205° C. for 1 minute on a hot plate to form underlayer coatings (film thickness 0.22 μm). Then, dry etching rate (decrease in film thickness per unit time) on these underlayer coatings was measured with RIE system ES401 manufactured by Nippon Scientific Co., Ltd. under the condition in which $CF_4$ was used as dry etching gas. The results are shown in Table 2. The dry etching selectivity corresponds to dry etching rate of an underlayer coating in case where the dry etching rate of the photoresist for KrF laser lithography (trade name: SEPR430 manufactured by Shin-etsu Chemical Co., Ltd.) under a similar condition as above is regarded as 1.00.

TABLE 2

| | Dry-Etching Selectivity |
|---|---|
| Example 1 | 1.3 |
| Example 2 | 1.3 |
| Example 3 | 1.9 |
| Example 4 | 1.8 |
| Example 5 | 1.3 |
| Example 6 | 1.6 |
| Example 7 | 1.6 |
| Example 8 | 1.1 |

It was confirmed that the etching rate of the underlayer coatings obtained from the underlayer coating forming compositions of Examples 1 to 8 was higher that of the photoresists. An underlayer coating is required to have a higher dry etching rate than a photoresist owing to the following reasons: in the process in which the base of the substrate is exposed after development of the photoresist formed on the underlayer coating, the developed photoresist pattern can be transferred to a substrate accurately because the underlayer coating is removed before the photoresist is scraped out as the underlayer coating has a higher dry etching rate than the photoresist.

The invention claimed is:

1. A method for forming an underlayer coating for use in manufacture of a semiconductor device, comprising:
    applying an underlayer coating forming composition for lithography on a semiconductor substrate having holes arranged in an Iso pattern and having holes arranged a Dense pattern, the semiconductor substrate being selected from the group consisting of silicon/silicon dioxide coated substrates, silicon wafer substrates, silicon nitride substrates, and ITO substrates, wherein
    the Iso pattern of holes is a pattern in which the distance from the center of a hole to the center of an adjacent hole is five times as long as the diameter of the hole, and
    the Dense pattern of holes is a pattern in which the distance from the center of a hole to the center of the adjacent hole is one time as long as the diameter of the hole; and baking the semiconductor substrate after applying the underlayer coating forming composition,
wherein the underlayer coating forming composition comprises:
a solvent;
a compound having a molecular weight of 1500 or less and having 2 to 6 protected carboxyl groups of formula (4):

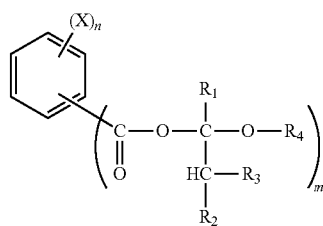

(4)

wherein
$R_1$ and $R_2$ are, independently of one another, a hydrogen atom or a $C_{1-10}$ alkyl group, and $R_3$ and $R_4$ together form a ring,
X is a hydrogen atom,
m is an integer of 2 to 6,
n is an integer of 0 to 4,
m and n satisfy m+n=6; and
a compound having two or more epoxy groups, wherein the compound having two or more epoxy groups comprises a polymer having a structural unit of formula (3):

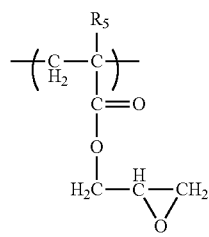

(3)

wherein $R_5$ is a hydrogen atom or a methyl group.

2. The method according to claim 1, wherein the compound having two or more epoxy groups further comprises a compound having a molecular weight of 1500 or less and having 2 to 6 epoxy groups.

3. The method according to claim 1, wherein the compound having a molecular weight of 1500 or less and having 2 to 6 protected carboxyl groups of formula 4 has a molecular weight from 400 to 800.

4. The method according to claim 1, wherein the holes of the semiconductor substrate have an aspect ratio in height/diameter of 1 or more.

5. A method for flattening a surface of a semiconductor substrate comprising holes having an aspect ratio shown in height/diameter of 1 or more, comprising:
applying an underlayer coating forming composition for lithography on the semiconductor substrate, the holes of the semiconductor substrate being present in an Iso pattern and a Dense pattern, wherein
the Iso pattern of holes is a pattern in which the distance from the center of a hole to the center of an adjacent hole is five times as long as the diameter of the hole, and the Dense pattern of holes is a pattern in which the distance from the center of a hole to the center of the adjacent hole is one time as long as the diameter of the hole; and
baking the semiconductor substrate after applying the underlayer coating forming composition,
wherein a flattening rate is 100% and the underlayer coating forming composition comprises:
a solvent;
a compound having two or more epoxy groups, wherein the compound having two or more epoxy groups comprises a polymer having a structural unit of formula (3):

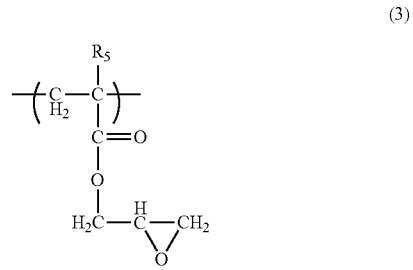

(3)

wherein $R_5$ is a hydrogen atom or a methyl group; and
a compound having 2 to 6 protected carboxyl groups of formula (4):

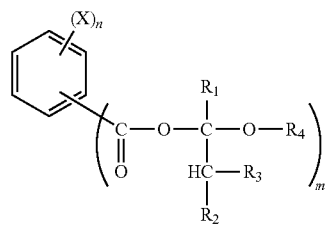

(4)

wherein:
$R_1$ and $R_2$ are, independently of one another, a hydrogen atom or a $C_{1-10}$ alkyl group, and $R_3$ and $R_4$ together form a ring;
X is a hydrogen atom;
m is an integer of 2 to 6;
n is an integer of 0 to 4;
m and n satisfy m+n=6;
the compound of formula (4) has a molecular weight of 1500 or less and is not a polymer.

6. The method according to claim 5, wherein the compound having two or more epoxy groups further comprises a compound having a molecular weight of 1500 or less and having 2 to 6 epoxy groups.

7. A method for forming a photoresist pattern for use in manufacture of a semiconductor device, comprising:
applying an underlayer coating forming composition for lithography on a semiconductor substrate having holes arranged in an Iso pattern and having holes arranged a Dense pattern, wherein
the Iso pattern of holes is a pattern in which the distance from the center of a hole to the center of an adjacent hole is five times as long as the diameter of the hole, and
the Dense pattern of holes is a pattern in which the distance from the center of a hole to the center of the adjacent hole is one time as long as the diameter of the hole;

baking the semiconductor substrate to form an underlayer coating;

forming a photoresist layer on the underlayer coating;

exposing the semiconductor substrate covered with the underlayer coating and the photoresist layer to light; and developing after exposing to light, wherein the underlayer coating forming composition comprises:

a solvent;

a compound having two or more epoxy groups, wherein the compound having two or more epoxy groups comprises a polymer having a structural unit of formula (3):

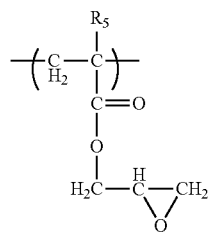

(3)

wherein $R_5$ is a hydrogen atom or a methyl group; and a compound having 2 to 6 protected carboxyl groups of formula (4):

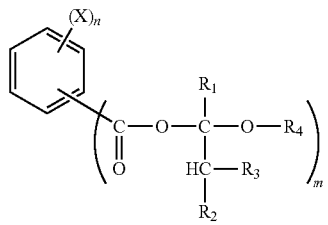

(4)

wherein:

$R_1$ and $R_2$ are, independently of one another, a hydrogen atom or a $C_{1-10}$ alkyl group, and $R_3$ and $R_4$ together form a ring;

X is a hydrogen atom;

m is an integer of 2 to 6;

n is an integer of 0 to 4;

m and n satisfy m+n=6;

the compound of formula (4) has a molecular weight of 1500 or less and is not a polymer.

8. The method according to claim 7, wherein the compound having two or more epoxy groups further comprises a compound having a molecular weight of 1500 or less and having 2 to 6 epoxy groups.

* * * * *